United States Patent [19]

Friedrich

[11] 3,967,365  
[45] July 6, 1976

[54] PROCESS FOR THE PRODUCTION OF A TWO-PHASE CHARGE SHIFT ASSEMBLY

[75] Inventor: Hans Friedrich, Poering, Germany

[73] Assignee: Siemens Aktiengesellschaft, Berlin & Munich, Germany

[22] Filed: Aug. 9, 1974

[21] Appl. No.: 496,153

[30] Foreign Application Priority Data

Aug. 24, 1973 Germany............................ 2342923

[52] U.S. Cl..................................... 29/579; 357/24; 357/91
[51] Int. Cl.².......................................... B01J 17/00
[58] Field of Search .................. 29/579; 357/91, 24

[56] References Cited
UNITED STATES PATENTS

| | | | |
|---|---|---|---|
| 3,796,932 | 6/1971 | Amelio | 357/91 |
| 3,829,884 | 1/1972 | Borel | 357/24 |
| 3,873,371 | 11/1972 | Wolf | 357/91 |

*Primary Examiner*—W. Tupman
*Attorney, Agent, or Firm*—Hill, Gross, Simpson, Van Santen, Steadman, Chiara & Simpson

[57] ABSTRACT

A two-phase charge shift assembly is described, as well as the process for its production. The process consists of applying an insulating layer to a semiconductor substrate, applying a highly ohmic polycrystalline silicon layer to the insulating layer, forming metal electrodes on the polycrystalline layer to thereby protect the zones lying beneath the electrodes, implanting charge carriers by ion implantation in an oblique direction into zones of the layer of polycrystalline silicon to thereby form electrodes in the layer which serve as electrodes between the electrically insulating zones of polycrystalline material.

6 Claims, 5 Drawing Figures

PROCESS FOR THE PRODUCTION OF A TWO-PHASE CHARGE SHIFT ASSEMBLY

BACKGROUND OF THE INVENTION

1. Field of the Invention

This invention is in the field of two-phase charge shift assemblies in which selective ion implantation in a layer of polycrystalline material is used to form electrodes which do not overlap at the various levels of the device.

2. Description of the Prior Art

Processes for the production of two-phase charge shift arrangements are known, as evidenced by the publication of the Solid State Circuits Conference (1972), Record NEREM, pages 157 to 160, which describes an arrangement of this type in which electrodes are arranged on two different levels. A disadvantage of such an arrangement, however, resides in the fact that the electrodes of the various conductor path levels overlap. Accordingly, such charge shift arrangements occupy a relatively large amount of space. The present invention provides a process for the production of a two-phase charge shift arrangement in which overlapping of the electrodes at various levels is avoided.

SUMMARY OF THE INVENTION

The present invention provides a process for the production of a two-phase charge shift assembly in which an electrically insulating layer such as silicon dioxide is applied to a substrate composed of semiconductor material such as silicon. Next, a layer of highly ohmic polycrystalline silicon is applied to the insulating silicon dioxide layer. Metal electrodes are applied to the layer of polycrystalline silicon by means of the conventional photolithographic process. These electrodes are arranged so that they protect the underlying zones of the polycrystalline silicon layer from ion implantation. Next, step charge carriers are implanted in an oblique direction into the zones of the layer of polycrystalline silicon in an ion implantation step. The result is the production of electrically conductive zones which serve as electrodes and electrically insulating zones in the layer of polycrystalline silicon.

As a result of the oblique implantation through the gaps between the individual metal electrodes, conductive zones which serve as electrodes for the charge shift are formed in the polycrystalline silicon layer. The zones of polycrystalline silicon which have not been doped by the ion implantation and which lie beneath the metal electrodes have a high resistance and can be considered as electrically insulating. The polycrystalline silicon may be implanted with either boron or phosphorous ions.

The fundamental advantage of the process of the present invention in the production of a two-phase charge shift device resides in the fact that the silicon electrodes and the metal electrodes do not overlap and thus provide fundamentally more densely packed structures.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENT

The present invention is based upon the proposition that a polycrystalline silicon layer deposited on a substrate has such a high resistance that it can be used as an insulator. It is only after doping, for example, with boron or phosphorus that polycrystalline silicon has its resistance reduced so that it can be considered electrically conductive. In accordance with the present invention, the doping of individual zones of a polycrystalline layer provides zones in the layer which serve as control electrodes for a two-phase charge shift assembly.

Figure 1:
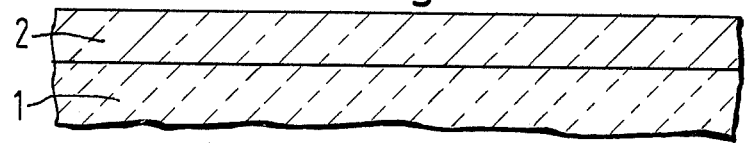
FIGS. 1 to 5 illustrate, on a greatly enlarged scale, the sequence of process steps which are involved in the production of a charge shift device according to the present invention.

Referring to FIG. 1, there is illustrated a substrate 1 preferably consisting of silicon. The surface of silicon is oxidized by any known process to produce a layer 2 of silicon dioxide. The thickness of the layer 2 preferably is about 1 micron.

Alternatively, the layer 2 may consist of silicon nitride ($Si_3N_4$) or aluminum oxide ($Al_2O_3$). The layer 2 can also consist of a double layer of silicon nitride and silicon dioxide or aluminum oxide and silicon dioxide.

Figure 2:
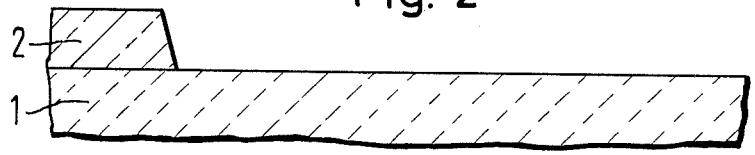

At the points where transistor structures and electrodes of the charge shift arrangement are to be provided, the layer 2 is selectively removed, as illustrated in FIG. 2, by the conventional photolithographic process steps.

Figure 3:

As shown in FIG. 3, the next step provides a gate oxide layer 21 which is applied to the exposed silicon substrate 1. The thickness of this gate oxide layer, preferably consisting of silicon dioxide, is approximately 1000 angstroms. A layer of polycrystalline silicon 3 is then deposited on the layer 21. The layer 3 preferably has a thickness of 0.1 to 1 micron, and more preferably from 0.3 to 0.4 microns.

Using the conventional photolithographic process steps, openings 22 and 23 are etched into the layers 3 and 21. Such openings are provided wherever diffusion zones, for example, for the production of field effect transistors, are later to be formed beneath the layers 3 and 21.

Figure 4:
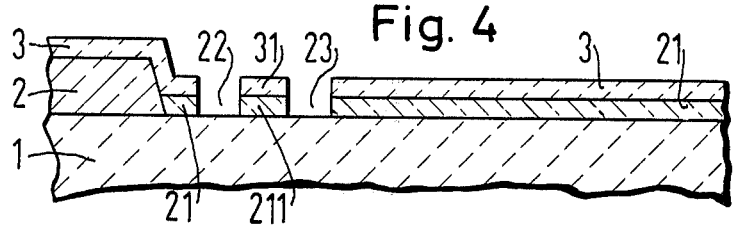
Figure 5:
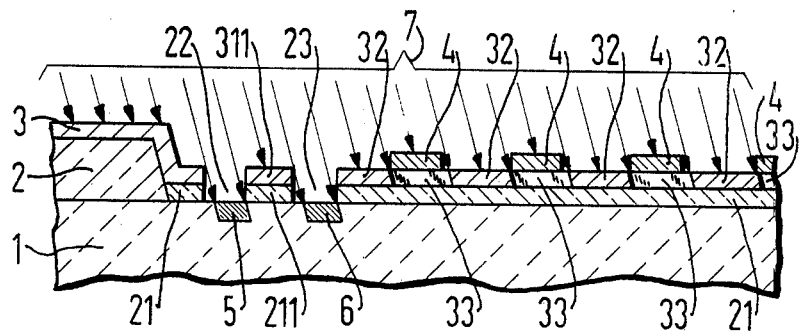

Two such openings have been illustrated in FIG. 4. As illustrated in FIG. 5, metal electrodes 4 are positioned on the layer of polycrystalline silicon 3, again with the aid of photolithographic process steps which are themselves old in the art. These metal electrodes 4 preferably consist of aluminum and represent the control electrodes of the charge shift assembly which lie at the second level.

An ion implantation step is next employed in which an ion beam is directed in an oblique direction into the entire arrangement as shown in FIG. 5. The ion beams have been identified at reference numeral 7. During the ion implantation with ions such as boron or phosphorus, the metal electrodes 4 which are positioned on the polycrystalline silicon layer 3 cause the zones lying beneath these metal electrodes 4 to be protected from the ion implantation. In FIG. 5, these zones are referred to at reference numeral 33. After the ion implantation, these zones 33 can be considered as electrically insulating. All the other zones of the layer of polycrystalline silicon 3 are implanted with ions and thus become relatively low ohmic resistors and electrically conductive. The zones 32 formed in this way in the layer of polycrystalline silicon 3 represent the control electrodes of the charge shift assembly in the first level. The ion implantation in an oblique direction causes a shading at one edge of the electrodes 4 so that the zones 32 are not connected to the electrodes which exhibit this edge. On the other edge of the electrodes 4, no shading is produced by the ion implantation so an electrical connection is formed between these electrodes and the zones 32 which are adjacent to the latter.

The zones 5 and 6 which lie beneath the openings 22 and 23 are likewise doped with boron or phosphorous ions. These zones represent the source or drain zone of a field effect transistor. The gate insulator of this transistor is shown at reference numeral 211 and the gate electrode is shown at 311. Such a transistor is located at the beginning of the charge shift arrangement and serves to input couple charge carriers into the charge shift path.

Using conventional process steps, a silicon dioxide layer is pyrolytically deposited on the entire arrangement. Above the electrodes 4 and 32 of the charge shift device and the gate electrode 311 of the field effect transistor and the diffusion zones 5 and 6 of the transistor, there are openings etched into the silicon dioxide layer. A metal layer, preferably an aluminum layer, is then applied to the assembly which has thus been formed and which, for simplification purposes, has not been shown in the drawings. The final step consists in further photolithographic process steps to provide the desired conductor path pattern by etching out this metal layer.

It should be evident that various modifications can be made to the described embodiments without departing from the scope of the present invention.

I claim as my invention:

1. A process for the production of a two-phase charge shift assembly comprising applying an insulating layer to a semiconductor substrate, applying a highly ohmic polycrystalline silicon layer to said insulating layer, forming metal electrodes on said polycrystalline layer, said electrodes being arranged so that they protect the substantially non-conductive polycrystalline zones lying beneath them, said metal electrodes having spaced edges thereon, implanting charge carriers by ion implantation in an oblique direction with respect to said edges and the surface of said substrate into zones of said layer of polycrystalline silicon to thereby form conductive electrodes in the layer of polycrystalline silicon to serve as electrodes between electrically insulating zones of polycrystalline material, some of said edges shading the underlying polycrystalline layer against ion implantation so that no electrical connections exist between the electrodes and the polycrystalline layer at said edges, while ion implantation occurs at others of said edges to thereby provide electrical connections between such other edges and the ion implanted polycrystalline layer.

2. The process of claim 1 in which said substrate consists of silicon.

3. The process of claim 2 in which the insulating layer consists of silicon dioxide.

4. The process of claim 1 in which said metal electrodes consist of aluminum.

5. The process of claim 4 in which the thickness of the electrodes is in the range from 0.1 to 1.0 micron 6. The process of claim 1 in which the charge carriers are produced from the implantation of boron or phosphorous ions.

* * * * *